United States Patent
Yoo et al.

(10) Patent No.: US 9,101,064 B2
(45) Date of Patent: Aug. 4, 2015

(54) THIN FILM ELECTRODE CERAMIC SUBSTRATE AND METHOD FOR MANUFACTURING THE SAME

(75) Inventors: Won Hee Yoo, Gyeonggi-do (KR); Byeung Gyu Chang, Gyeonggi-do (KR); Taek Jung Lee, Gyeonggi-do (KR); Yun Hwi Park, Gyeonggi-do (KR)

(73) Assignee: SAMSUNG ELECTRO-MECHANICS CO., LTD., Suwon (KR)

( * ) Notice: Subject to any disclaimer, the term of this patent is extended or adjusted under 35 U.S.C. 154(b) by 123 days.

(21) Appl. No.: 13/548,575

(22) Filed: Jul. 13, 2012

(65) Prior Publication Data

US 2013/0032383 A1     Feb. 7, 2013

(30) Foreign Application Priority Data

Aug. 5, 2011 (KR) .................. 10-2011-0078188

(51) Int. Cl.

| | |
|---|---|
| *H05K 1/03* | (2006.01) |
| *H05K 1/09* | (2006.01) |
| *H05K 3/02* | (2006.01) |
| *H05K 3/06* | (2006.01) |
| *H05K 3/10* | (2006.01) |

(52) U.S. Cl.
CPC .. *H05K 3/06* (2013.01); *H05K 1/03* (2013.01); *H05K 1/09* (2013.01); *H05K 3/02* (2013.01); *H05K 1/0306* (2013.01); *H05K 3/107* (2013.01); *H05K 2201/0317* (2013.01); *H05K 2203/025* (2013.01)

(58) Field of Classification Search
CPC . H05K 3/06; H05K 1/0306; H05K 2203/025; H05K 3/107; H05K 2201/0195; H05K 3/999; H05K 1/111; H05K 1/092; H05K 2201/098; H05K 3/4629; H05K 2201/0376; H05K 3/4007; H05K 3/4611
See application file for complete search history.

(56) References Cited

U.S. PATENT DOCUMENTS

| | | | |
|---|---|---|---|
| 5,731,066 A * | 3/1998 | Ando et al. | 428/210 |
| 2010/0051172 A1* | 3/2010 | Kim et al. | 156/89.12 |
| 2011/0186336 A1* | 8/2011 | Nakayama | 174/255 |

FOREIGN PATENT DOCUMENTS

| | | |
|---|---|---|
| JP | 9-283657 | 10/1997 |
| JP | 2005-158887 | 6/2005 |
| JP | 2009-295661 | 12/2009 |
| JP | 2010-141001 | 6/2010 |

* cited by examiner

Primary Examiner — Ishwarbhai B Patel

(57) ABSTRACT

Disclosed herein are a thin film electrode ceramic substrate and a method for manufacturing the same. The thin film electrode ceramic substrate includes: a ceramic substrate; one or more anti-etching metal layers formed in a surface of the ceramic substrate; thin film electrode pattern formed on the anti-etching metal layers; and a plating layer formed on the thin film electrode pattern, wherein respective edge portions of the thin film electrode pattern are contacted with the anti-etching metal layer, and thus, an undercut defect occurring between the surface of the ceramic substrate and the thin film electrode pattern and between the thin film electrode patterns due to an etchant can be prevented and the binding strength of the entire thin film electrode pattern can be enhanced, resulting in securing durability and reliability of the thin film electrode patterns.

6 Claims, 4 Drawing Sheets

- PRIOR ART -

- PRIOR ART -

THIN FILM ELECTRODE CERAMIC SUBSTRATE AND METHOD FOR MANUFACTURING THE SAME

CROSS REFERENCE(S) TO RELATED APPLICATIONS

This application claims the benefit under 35 U.S.C. Section 119, of Korean Patent Application Serial No. 10-2011-0078188, entitled "Thin Film Electrode Ceramic Substrate and Method for Manufacturing the Same" filed on Aug. 5, 2011, which is hereby incorporated by reference in its entirety into this application.

BACKGROUND OF THE INVENTION

1. Technical Field

The present invention relates to a thin film electrode ceramic substrate and a method for manufacturing the same.

2. Description of the Related Art

Recently, electronic components used in a mobile communication field are increasingly required to be small-sized, integrated, modularized, and allow high frequency, due to the technical advancement in mobile communication. In order to satisfy these required techniques, high-temperature co-fired ceramic (HTCC) or low-temperature co-fired ceramic (LTCC) multilayer substrates are widely used.

A demand for ceramic substrate in which a thin film electrode pattern, without using the existing electrode printing method, is applied onto a surface of a highly integrated multilayer substrate for a probe card, which tests a high-frequency module, a microwave connector, a cable assembly, a semiconductor chip, and the like, for current mobile communication, is increasing. The reason is that the thin film electrode pattern enables fine patterns to be formed on a surface of the ceramic substrate, as compared with the existing printing electrode pattern, and a thickness of the plating layer is increased.

An HTCC multilayer substrate is manufactured by thermal treatment at a temperature of 1500° C. or higher. As for materials for the HTCC ceramic multilayer substrate, 94% or more of alumina is used as a main raw material and a small amount of $SiO_2$ is used as an additive. As a material for the electrode pattern, tungsten (W) that can be high-temperature fired is mainly used.

The HTCC ceramic multilayer substrate has excellent mechanical strength and chemical-resistant property, and thus is widely used as a highly integrated package, by forming thin film electrode patterns on a substrate surface. However, the high-temperature fired tungsten (W) electrode pattern has lower electrical conductivity than silver (Ag) or copper (Cu), resulting in deteriorating high frequency characteristics, and has about 2 times higher thermal expansion coefficient than a silicon semiconductor device, resulting in raising problems in an application field where matching of the thermal expansion coefficient is requested.

While, the LTCC ceramic multilayer substrate is manufactured by thermal treatment at a temperature of 900° C. or lower. In order to use the LTCC ceramic multilayer substrate at a low temperature of 900° C. or less, a large amount of $SiO_2$ having a low melting point is used and a relatively small amount of alumina is used. Silver (Ag) or copper (Cu) can be used as a material for electrode patterns because a firing temperature is 900° C. or less, and thus, resistors, inductors, and condensers, which are passive elements, are embedded inside the substrate. Therefore, the LTCC ceramic multilayer substrate is widely used to make electronic components be small-sized, integrated, modularized, and allow high frequency.

However, since the LTCC ceramic multilayer substrate contains much $SiO_2$, a substrate surface, in which $SiO_2$ is contained, is easily etched during an etching process using a strong acid type chemical material such as hydrofluoric acid (HF) or a strong base type chemical material such as potassium hydroxide (KOH), and thereby to reduce the binding strength of thin film electrode patterns formed on a surface of the LTCC multilayer substrate.

FIG. 1 shows a procedure of forming thin film electrode patterns on a surface of a ceramic multilayer substrate according to the related art.

First, fine thin film electrode layers 11 and 12 are formed on a ceramic multilayer substrate 10. Then, a photosensitive protective layer 13 is formed on the fine thin film electrode layers 11 and 12. Then, the photosensitive protective layer 13 is exposed and developed so as to embody electrode patterns to be formed on a surface of the ceramic multilayer substrate 10. Then, a plating layer 14 is formed in a part in which a portion of the photosensitive protective layer 13 is removed by development. Then, the photosensitive protective layer 13 is removed. Finally, the thin film electrode layers 11 and 12 are sequentially etched to leave electrode patterns 11 and 12 and a plating pattern 14 on the surface of the final multilayer ceramic substrate 10.

The thin film electrode layers 11 and 12 are made of, for example, a titanium (Ti) electrode 11 and a copper (Cu) electrode 12. However, a problem occurs in etching the titanium (Ti) electrode 11 formed on the multilayer ceramic substrate 10. Generally, an etchant used at the time of etching titanium contains a strong acid type chemical material such as hydrofluoric acid (HF) or a strong base type chemical material such as potassium hydroxide (KOH).

For this reason, as shown in FIG. 2, when the Ti electrode 11 is etched, the surface of the ceramic multilayer substrate, in which a large amount of $SiO_2$ is contained, is easily etched. Furthermore, undercut occurs between the surface of the substrate 10 and the titanium electrode 11 and the copper electrode 12 and the titanium electrode 11 (see, "A"), and thus, a thin film electrode pattern is difficult to form, and the binding strength of the thin film electrode pattern to the surface of the substrate is reduced even though the thin film electrode pattern is formed.

SUMMARY OF THE INVENTION

An object of the present invention is to provide a thin film electrode ceramic substrate in which an undercut defect does not occur due to etching of an electrode pattern by an etchant, at an edge portion where a surface of a ceramic multilayer substrate and a thin film electrode pattern are contacted with each other, at the time of forming the thin film electrode pattern on the surface of the ceramic substrate.

Another object of the present invention is to provide a method for manufacturing the thin film electrode ceramic substrate.

According to an exemplary embodiment of the present invention, there is provided a thin film electrode ceramic substrate, including: a ceramic substrate; one or more anti-etching metal layers formed in a surface of the ceramic substrate; a thin film electrode pattern formed on the anti-etching metal layers; and a plating layer formed on the thin film electrode pattern, wherein respective edge portions of the thin film electrode pattern are contacted with the anti-etching metal layer.

The anti-etching metal layer may have a larger width than the thin film electrode pattern.

The anti-etching metal layers may be spaced apart from each other by a predetermined distance, except in a region where the anti-etching metal layers are contacted with the respective edge portions of the thin film electrode pattern, or may be connected to each other.

The anti-etching metal layer may be formed in the surface of the ceramic substrate in an intaglio type.

The anti-etching metal layer may be formed of at least one material selected from the group consisting of silver (Ag), copper (Cu), nickel (Ni), and gold (Au).

The plating layer may be formed in at least one layer.

The plating layer may be constituted by sequentially forming a copper (Cu) layer/a nickel (Ni) layer/a gold (Au) layer.

According to another exemplary embodiment of the present invention, there is provided a method for manufacturing a thin film electrode ceramic substrate, including: forming an anti-etching metal layer in a surface of a ceramic substrate; forming a thin film electrode layer on the anti-etching metal layer; forming a photosensitive protective layer on the thin film electrode layer; exposing and developing the photosensitive protective layer; forming a plating layer on a region where the photosensitive protective layer is developed; removing the photosensitive protective layer; and etching the thin film electrode layer to form a thin film electrode pattern.

The anti-etching metal layer may be formed in the surface of the ceramic substrate in an intaglio type.

The anti-etching metal layer may be formed by forming an intaglio pattern in a fired substrate and filling the intaglio pattern with a material for forming an anti-etching metal layer.

The anti-etching metal layer may be formed by forming an anti-etching metal layer in the ceramic substrate before firing the ceramic substrate, firing the ceramic substrate, and polishing a surface of the ceramic substrate in which the anti-etching metal layer is formed.

In the exposing and developing of the photosensitive protective layer, a width of a region where the photosensitive protective layer may be developed is smaller than a width of the anti-etching metal layer.

When the number of thin film electrode patterns is one or more, the etching of the thin film electrode layer may be performed by sequentially etching thin film electrode layers for the respective thin film electrode patterns.

DESCRIPTION OF THE PREFERRED EMBODIMENTS

Hereinafter, the present invention will be described in more detail.

Terms used in the present specification are for explaining the embodiments rather than limiting the present invention. Unless explicitly described to the contrary, a singular form includes a plural form in the present specification. Also, used herein, the word "comprise" and/or "comprising" will be understood to imply the inclusion of stated constituents, steps, operations and/or elements but not the exclusion of any other constituents, steps, operations and/or elements.

As used throughout the claims and specification of the present invention, the term 'electrode layer' means a state in which the entire surface of a substrate is coated with a material constituting the electrode layer.

As used throughout the claims and specification of the present invention, the term 'electrode pattern' means an electrode layer formed on the substrate after etching the 'electrode layer'.

As used throughout the claims and specification of the present invention, the term 'thin film' means a state in which the thin film is finely coated to have a thickness within about 0.5 μm, and preferably, within about 0.2 μm.

As used throughout the claims and specification of the present invention, the term 'anti-etching metal layer is formed in a surface of a ceramic substrate in an intaglio type' means that the anti-etching metal layer is formed from the surface of the substrate in a concave shape or inwardly from the surface of the substrate.

The present invention is directed to a thin film electrode ceramic substrate in which an electrode pattern of a thin film is formed on a ceramic substrate, and a method for manufacturing the same.

Figure 4:
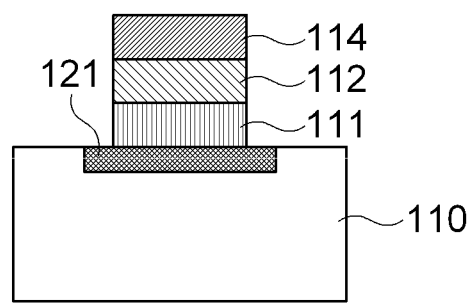

A thin film electrode ceramic substrate according to an exemplary embodiment of the present invention is shown in FIG. 4. Referring to FIG. 4, the thin film electrode ceramic substrate includes a ceramic substrate 110, an anti-etching metal layer 121 formed in a surface of the ceramic substrate 110, electrode patterns 111 and 112 formed on the anti-etching metal layer 121, and a plating layer 114 formed on the electrode patterns 111 and 112. Respective edge portions of the electrode patterns 111 and 112 are contacted with the anti-etching metal layer 121.

Generally, an undercut phenomenon between a surface of the ceramic substrate and the thin film electrode pattern occur at edge portions of the thin film electrode pattern. This undercut defect occurs because the surface of the ceramic substrate is etched by thin film electrode materials.

Therefore, in the present invention, the anti-etching metal layer 121 which is not etched by the thin film electrode materials is formed in the surface of the ceramic substrate 110, and respective edge portions of the electrode patterns 111 and 112 are not contacted with the surface of the ceramic substrate 110 but contacted with the anti-etching metal layer 121 (see, circle portions shown by dotted line) Therefore, a thin film electrode ceramic substrate, in which the binding strength of the thin film electrode pattern is improved, can be manufactured.

The ceramic substrate 110 of the present invention is a substrate in which a plurality of layers are laminated. Examples thereof may be a high-temperature co-fired ceramic substrate, a low-temperature co-fired ceramic substrate, and the like, but are not limited thereto. However, the low-temperature co-fired ceramic substrate, in which a large amount of SiO$_2$ having a low melting point is used, may be more usefully used.

In the present invention, the anti-etching metal layer 121 is particularly provided in the surface of the ceramic substrate 110, and the anti-etching metal layer 121 is preferably formed in the surface of the ceramic substrate 110 in an intaglio type.

Therefore, the anti-etching metal layer 121 according to the present invention is formed in the surface of the ceramic substrate 110 in an intaglio type, and is preferably formed at the same height as the ceramic substrate 110, substantially.

According to the exemplary embodiment of the present invention, the anti-etching metal layer 121 may be formed of at least one material selected from the group consisting of silver (Ag), copper (Cu), nickel (Ni), and gold (Au).

The anti-etching metal layer according to the present invention may be formed before or after firing the ceramic substrate.

When the anti-etching metal layer is formed before firing the ceramic substrate, the anti-etching metal layer is formed in the ceramic substrate, followed by firing of the ceramic substrate, and the resulting substrate is partially polished to expose the anti-etching metal layer.

Meanwhile, when the anti-etching metal layer is formed after firing the ceramic substrate, an intaglio pattern is formed in the fired substrate and then filled with an anti-etching metal material.

Figure 3:
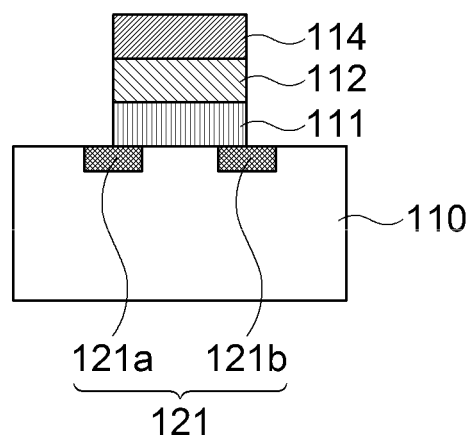
FIGS. 3 and 4 show cross sectional structures of thin film electrode ceramic substrates of the present invention.

Then, referring to FIG. 3, anti-etching metal layers 121a and 121b according to the present invention are preferably formed to have a larger width than the thin film electrode patterns 111 and 112 formed on the ceramic substrate 110.

That is to say, the anti-etching metal layers 121a and 121b preferably have a larger width than the thin film electrode patterns 111 and 112. So long as the anti-etching metal layers 121a and 121b are contacted with the edge portions of the thin film electrode patterns 111 and 112, the anti-etching metal layers 121a and 121b may be spaced apart from each other by a predetermined distance, as shown in FIG. 3, or the anti-etching metal layers 121a and 121b may be formed so as to be connected to each other, as shown in FIG. 4.

The thin film electrode pattern includes at least one plating layer 114. The plating layer may be constituted by sequentially forming a copper (Cu) layer/a nickel (Ni) layer/a gold (Au) layer.

Hereinafter, a method of manufacturing a thin film electrode ceramic substrate according to the present invention will be described with reference to the accompanying drawings.

Figure 5:
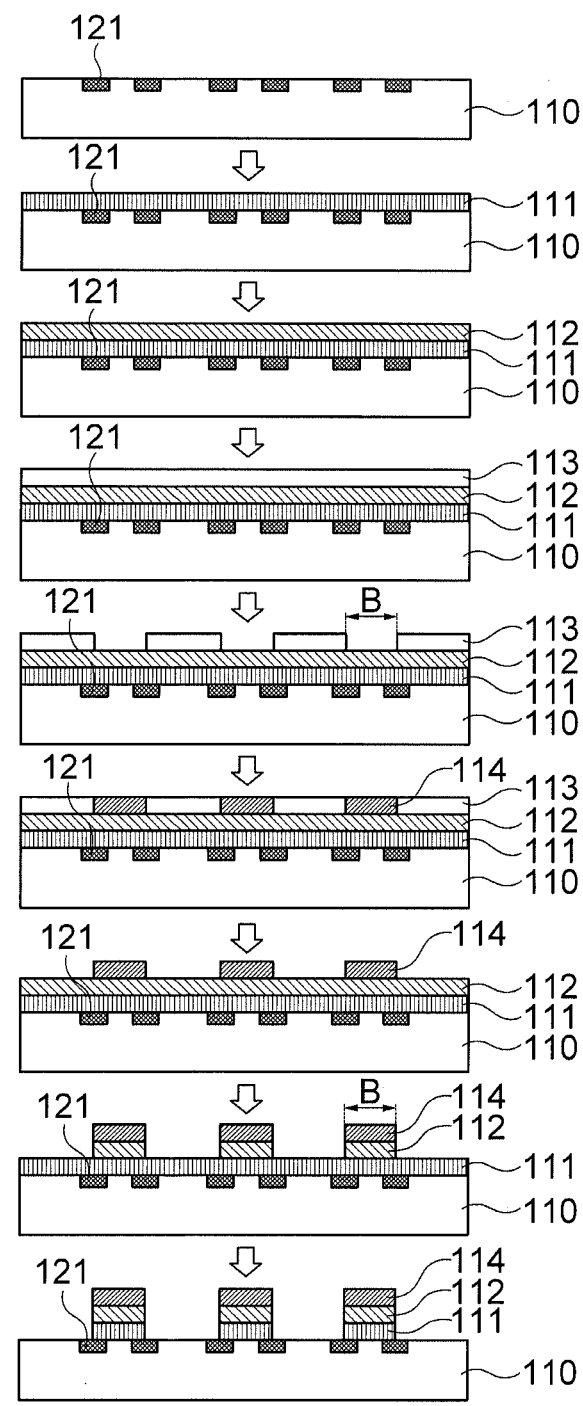
FIG. 5 shows a procedure of manufacturing a thin film electrode ceramic substrate according to an exemplary embodiment of the present invention.

Referring to FIG. 5, as for a first step, an anti-etching metal layer 121 is formed in a surface of a ceramic substrate 110 at edge portions of thin film electrode patterns to be finally formed in a surface direction. The anti-etching metal layer 121 has a larger width than the edge portions of the thin film electrode pattern.

Figure 6:
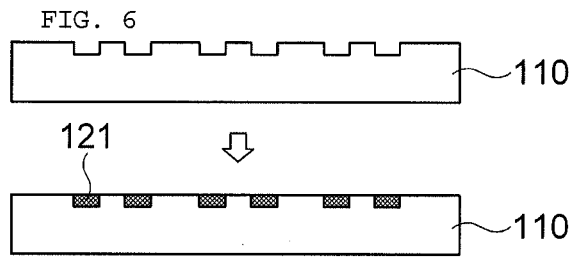
FIGS. 6 and 7 show examples of forming an anti-etching metal layer according to the exemplary embodiment of the present invention.

The forming of the anti-etching metal layer 121 in the surface of the ceramic substrate 110 may be performed in the surface of the ceramic substrate after firing is finished, as shown in FIG. 6. In this case, an intaglio pattern 120 is formed in the fired substrate 110, and filled with a material for forming an anti-etching metal layer, thereby forming an anti-etching metal layer 121.

Figure 7:
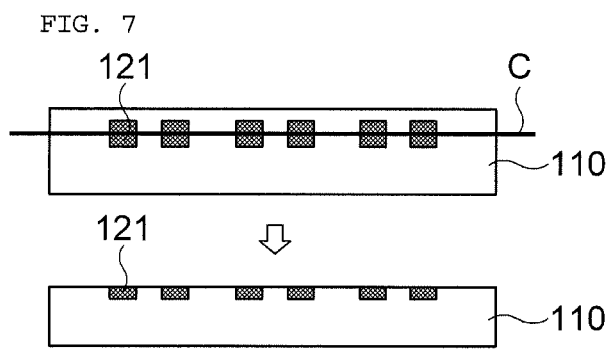

Also, as shown in FIG. 7, the anti-etching metal layer 121 is formed in the ceramic substrate 110 before firing, and then the ceramic substrate 110 is fired. After firing is completed, a portion (see, mark "C") of the surface of the ceramic substrate 110 is polished to expose the anti-etching metal layer 121 to the surface of the ceramic substrate 110.

The anti-etching metal layer according to the present invention has the same height as the surface of the ceramic substrate in order to secure efficiency in a process of forming the thin film electrode patterns and forming the final flatness thereof, and thus, it is advantageous to form the anti-etching metal layer without height difference.

Then, as for a second step, thin film electrode layers 111 and 112 are formed on the anti-etching metal layer 121. The thin film electrode layer may be formed in one layer or two or more layers, and the number of layers is not particularly limited.

In the exemplary embodiment of the present invention, a first thin film electrode layer 111 functioning as a seed thin film layer on the surface of the ceramic substrate and a second thin film electrode layer 112 on the first thin film electrode layer 111 are formed on the entire surface of the ceramic substrate in which the anti-etching metal layer 121 is formed.

The first thin film electrode layer 111 may be made of titanium (Ti) or chrome (Cr), but is not limited thereto.

Also, the second thin film electrode layer 112 may be made of copper (Cu) or nickel (Ni), but is not limited thereto.

In addition, if necessary, the thin film electrode layers may be formed in one layer or two or more layers, but the number of layers is not particularly limited.

Then, as for a third step, a photosensitive protective layer 113 is formed on the entire surface of the thin film electrode layers. The photosensitive protective layer 113 may be formed on the thin film electrode layer by using a photoresist composition or a dry film. A material for the photoresist composition or the dry film is not particularly limited, and any material that can be used in the art may be employed.

Then, as for a fourth step, the photosensitive protective layer 113 is exposed and developed so as to embody a thin film electrode pattern to be formed on the surface of the ceramic substrate 110. The photosensitive protective layer 113 formed by the exposing and developing processes needs to be included in a cross section of the anti-etching metal layer 121 formed in the surface of the ceramic substrate 110. That is to say, a distance (B) between photosensitive protective layers 113 formed through the fourth step is the same as the distance between the final thin film electrode patterns, as shown in FIG. 5. Therefore, the distance (B) between the photosensitive protective layers 113 is preferably shorter than the width of the anti-etching metal layer 121 so that the edge portions of the thin film electrode patterns are contacted with the anti-etching metal layer 121.

The photosensitive protective layer 113 according to the present invention is preferably formed to have a thickness of 15 to 40 μm, but not limited thereto.

Then, as for a fifth step, a plating layer 114 is formed in a region where the photosensitive protective layer is developed. The plating layer 114 may be formed in at least one layer. The plating layer 114 may be formed by sequentially forming Cu layer/Ni layer/Au layer through electroplating, but is not limited thereto.

Then, as for a sixth step, the photosensitive protective layer 113 is removed.

Finally, as for a seventh step, the thin film electrode layers 111 and 112 may be etched. The etching of the thin film electrode layers is preferably performed by sequentially etching the respective electrode thin film electrode layers, and here any etchant that can be commonly used may be employed.

When the etching step is performed, a thin film electrode ceramic substrate in which the final fine thin film electrode patterns 111 and 112 are formed at the distance the same as the distance (B) between the photosensitive protective layer 113 patterns. Further, the thin film electrode patterns 111 and 112 are not directly contacted with the ceramic substrate 110 but contacted with the anti-etching metal layer 121 formed in the surface of the ceramic substrate.

Therefore, the anti-etching metal layer 121 according to the present invention is not etched by a strong acid type chemical material such as hydrofluoric acid (HF) or a strong base chemical type chemical material such as potassium hydroxide (KOH), which is used as an etchant, and thus the undercut defect occurring at the edge portions of the thin film electrode patterns can be prevented.

Hereinafter, examples of the present invention will be described in detail. The following examples are only for illustrating the present invention, and the scope of the present invention should not be construed as being limited by this examples. In addition, specific compounds are used in the following examples, but it is obvious to those skilled in the art that equivalents thereof can exhibit the same or similar degrees of effects.

EXAMPLE

A thin film electrode ceramic substrate was manufactured through a series of processes as shown in FIG. 5.

First, intaglio type patterning was performed on a surface of a ceramic substrate, thereby forming an intaglio pattern in a predetermined thickness. The intaglio pattern was filled with a silver (Ag) powder paste to form an anti-etching metal layer. titanium (Ti) for a first thin film electrode layer was entirely coated on the surface of the substrate in which the anti-etching metal layer is formed. In addition, copper (Cu) for a second thin film electrode layer was entirely coated on the first thin film electrode layer.

Then, a photosensitive protective layer was formed by coating a photoresist composition on the second thin film electrode layer in a thickness of about 30 μm. In addition, the photosensitive protective layer was exposed and developed. A plating layer was formed by sequentially stacking copper layer/nickel layer/gold layer on the photosensitive protective layer using electroplating.

Then, the photosensitive protective layer was removed, and then the second thin film electrode layer was etched by using an etchant (pH 6~7) for copper. Finally, the first thin film electrode layer was etched by using HF, and thereby to manufacture the thin film electrode ceramic substrate in which fine thin film electrodes are formed.

COMPARATIVE EXAMPLE

Figure 1:
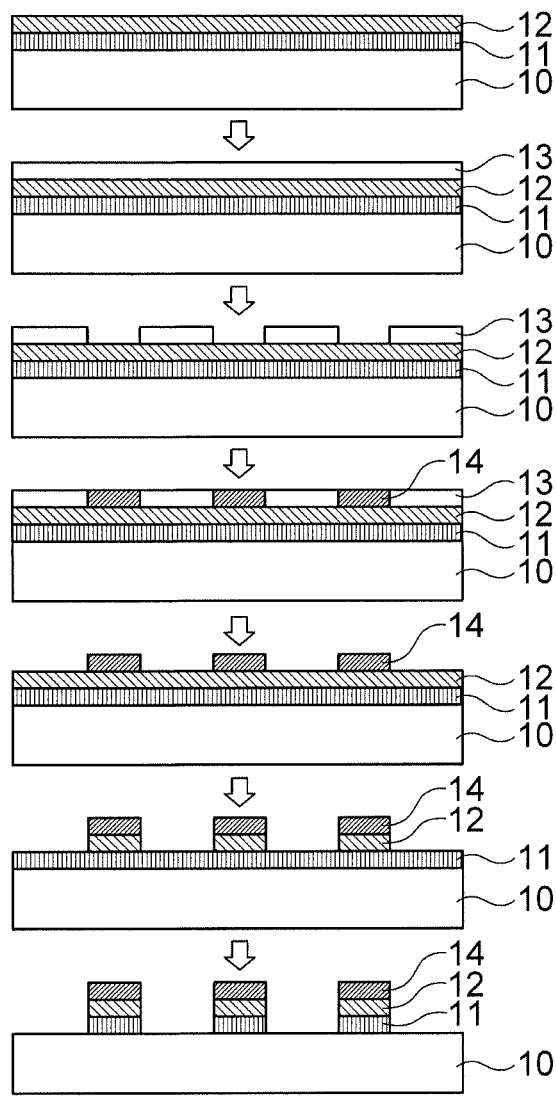
FIG. 1 shows a procedure of manufacturing a thin film electrode ceramic substrate according to the related art.
Figure 2:
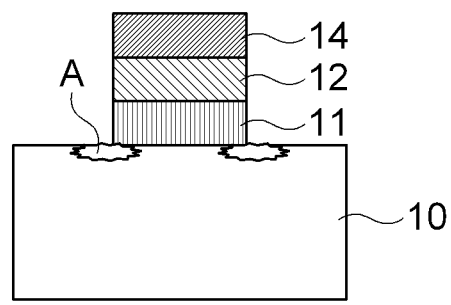
FIG. 2 shows a cross section for illustrating a defect occurring on an electrode and a ceramic substrate at the time of manufacturing the thin film electrode ceramic substrate of FIG. 2, according to the related art.

A thin film electrode ceramic substrate was manufactured by series of processes as shown in FIG. 1, without forming the anti-etching metal layer in the above example.

EXPERIMENTAL EXAMPLE

Test on Binding Strength of Thin Film Electrode Pattern

Figure 8:
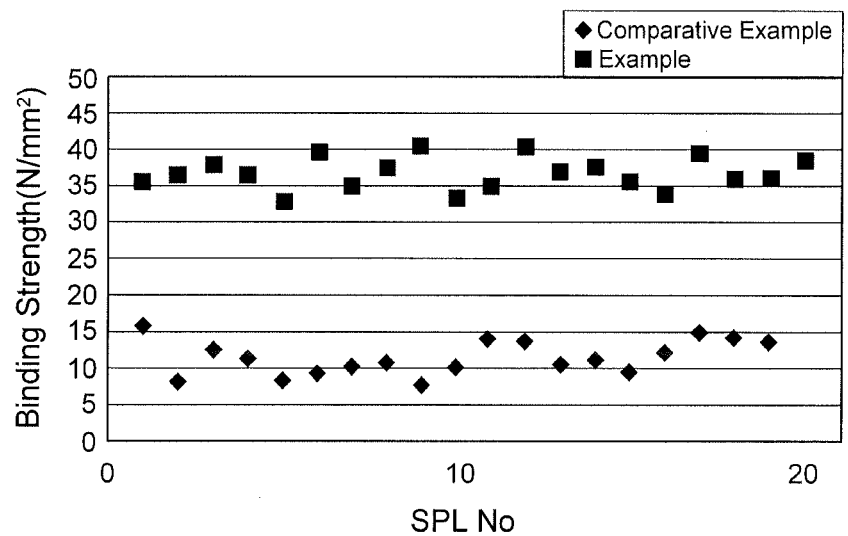
FIG. 8 is a graph showing binding strengths of thin film electrodes formed on surfaces of ceramic substrates of examples and a comparative example.

A binding strength of a thin film electrode pattern to a ceramic substrate in each of the example and the comparative example was measured by using a ball shear test (BST) measurement method, and the results were shown in FIG. 8.

According to FIG. 8, it can be confirmed that the average binding strength of the thin film electrode pattern according to comparative example, which was formed by the existing method, was 12 N/mm$^2$, and the binding strength of the thin film electrode pattern formed according to the example where anti-etching metal layer is applied to the ceramic substrate, was 36 N/m m$^2$, which was three times better than the comparative example.

According to the thin film electrode ceramic substrate of the present invention, an undercut defect occurring between the surface of the ceramic substrate and the thin film electrode pattern and between the thin film electrode patterns due to an etchant can be prevented, by forming an intaglio type anti-etching metal layer on the surface of the ceramic substrate.

In addition, the present invention can enhance the adhering strength of the edge portions of the thin film electrode pattern to the surface of the ceramic substrate, and thus, improve the binding strength of the entire thin film electrode pattern, resulting in securing durability and reliability of the thin film electrode patterns.

What is claimed is:

1. A thin film electrode ceramic substrate, comprising:
    a ceramic substrate;
    a plurality of anti-etching metal layers formed in a surface of the ceramic substrate;
    a thin film electrode pattern formed on the anti-etching metal layers; and
    a plating layer formed on the thin film electrode pattern,
    wherein the anti-etching metal layers are extant under respective edge portions of the thin film electrode pattern and extends, in the ceramic substrate, a distance away from the thin film electrode pattern,
    the edge portions of the thin film electrode pattern are contacted with the respective anti-etching metal layers,
    the anti-etching metal layers are spaced apart from each other by a predetermined distance, except in a region where the anti-etching metal layers are contacted with the respective edge portions of the thin film electrode pattern, and
    the ceramic substrate underlays entire bottom surfaces of the anti-etching metal layers.

2. The thin film electrode ceramic substrate according to claim 1, wherein the anti-etching metal layers are formed in the surface of the ceramic substrate in an intaglio type.

3. The thin film electrode ceramic substrate according to claim 1, wherein the anti-etching metal layers are formed at the same height as the surface of the ceramic substrate.

4. The thin film electrode ceramic substrate according to claim 1, wherein the anti-etching metal layers are formed of at least one material selected from the group consisting of silver (Ag), copper (Cu), nickel (Ni), and gold (Au).

5. The thin film electrode ceramic substrate according to claim 1, wherein the plating layer is formed in at least one layer.

6. The thin film electrode ceramic substrate according to claim 5, wherein the plating layer is constituted by sequentially forming a copper (Cu) layer/a nickel (Ni) layer/a gold (Au) layer.

* * * * *